(12) United States Patent
Yamaguchi (10) Patent No.: US 7,022,552 B2
(45) Date of Patent: Apr. 4, 2006

(54) SEMICONDUCTOR DEVICE AND METHOD FOR FABRICATING SEMICONDUCTOR DEVICE

(75) Inventor: Tadashi Yamaguchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/748,258

(22) Filed: Dec. 31, 2003

(65) Prior Publication Data

US 2004/0227251 A1    Nov. 18, 2004

(30) Foreign Application Priority Data

May 16, 2003   (JP)  ............................. 2003-138584

(51) Int. Cl.
*H01L 21/44*   (2006.01)

(52) U.S. Cl. ................ 438/113; 438/114; 438/460; 438/465

(58) Field of Classification Search ................ 257/777, 257/686, 780; 438/113, 114, 460, 461, 465
See application file for complete search history.

(56) References Cited

U.S. PATENT DOCUMENTS

| | | | |
|---|---|---|---|
| 6,107,164 A * | 8/2000 | Ohuchi | 438/465 |
| 6,391,685 B1 | 5/2002 | Hikita et al. | |
| 6,603,191 B1 * | 8/2003 | Wakabayashi et al. | 257/620 |
| 6,790,694 B1 * | 9/2004 | Sugiyama et al. | 438/33 |
| 6,964,915 B1 * | 11/2005 | Farnworth et al. | 438/460 |
| 2001/0026010 A1 | 10/2001 | Horiuchi et al. | |
| 2001/0038150 A1* | 11/2001 | Suzuki | 257/778 |
| 2002/0027257 A1* | 3/2002 | Kinsman et al. | 257/400 |

FOREIGN PATENT DOCUMENTS

| | | |
|---|---|---|
| JP | 06-005665 | 1/1994 |
| JP | 2000-243900 | 9/2000 |
| JP | 2001-210782 | 8/2001 |
| JP | 2001-339011 | 12/2001 |
| JP | 2002-093942 | * 3/2002 |
| JP | 2002-093942 A | * 3/2002 |

* cited by examiner

*Primary Examiner*—T. N. Quach
(74) *Attorney, Agent, or Firm*—Rabin & Berdo, PC (57) ABSTRACT

A semiconductor device includes a semiconductor chip having an electrode pad electrically connected to an integrated circuit and a conducting part electrically connected to the electrode pad; an insulating material formed on a side of the semiconductor chip; and a conductive pattern to extend from a top of a front side of the insulating material to the conducting part of the semiconductor chip.

10 Claims, 9 Drawing Sheets

SEMICONDUCTOR DEVICE AND METHOD FOR FABRICATING SEMICONDUCTOR DEVICE

BACKGROUND OF THE INVENTION

1. Field of the Invention

The present invention relates to a small-sized semiconductor device typified by CSP (Chip Size Package) and to a method for fabricating the same.

This application is counterpart of Japanese patent application, Serial Number 138584/2003, filed May 16, 2003, the subject matter of which is incorporated herein by reference.

2. Description of the Related Art

Traditionally, in integrated circuit packages having semiconductor devices such as semiconductor integrated circuits packaged, a demand for the realization of reduction in size and in thickness is increasing. In recent years, with a focus on the semiconductor integrated circuit package in the field for which the reduction in thickness is demanded particularly, CSP is proposed in which ball-shaped terminals are arranged on the surface of a semiconductor device in a grid shape.

Figure 11A:
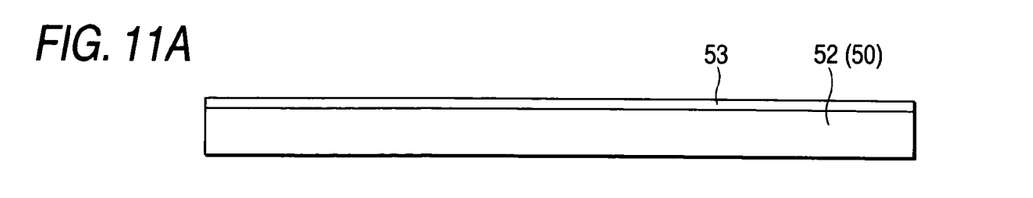
FIGS. 11A to 11D are process diagrams for illustrating the method for fabricating the traditional semiconductor device.
Figure 11B:
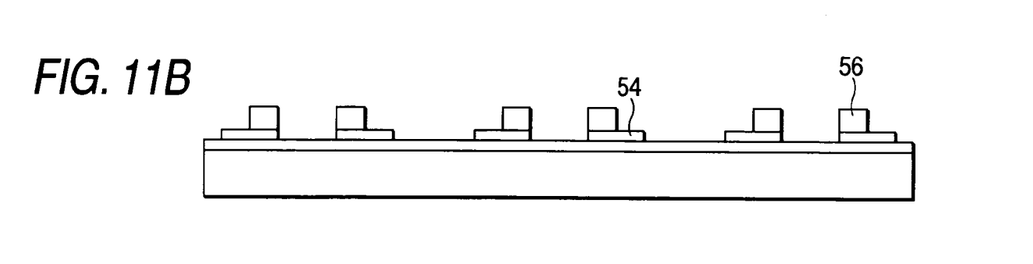
Figure 11C:
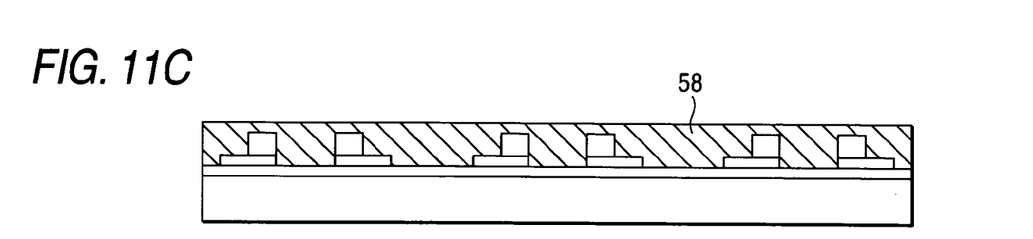
Figure 11D:
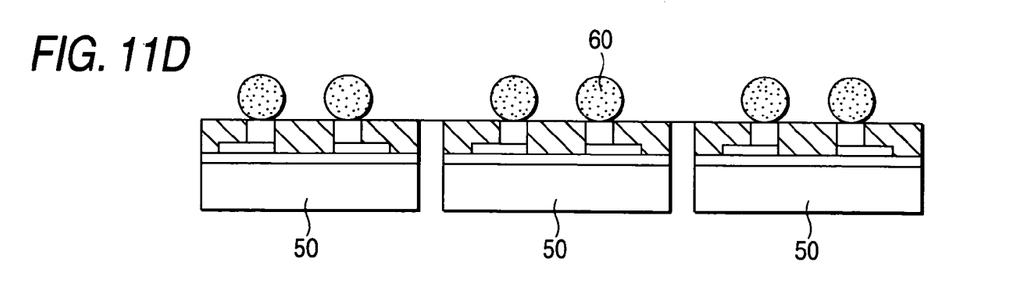

For example, the CSP is fabricated as shown in FIGS. 11A to 11D. Fist, a wafer 52 formed with devices to be semiconductor chips 50 is prepared, and an insulating film 53 such as polyimide is formed on the front side thereof (FIG. 11A). Then, a redistribution wiring layer 54 and posts 56 are formed on the front side of the insulating film 53 so as to be electrically connected to terminals of integrated circuits of the devices, not shown (FIG. 11B). Subsequently, after the entire front side is covered with an encapsulating resin 58 (FIG. 11C), the surfaces of the posts 58 are exposed by cutting, solder balls 60 are formed on the surfaces of the exposed posts 56, and the wafer is separated into individual pieces to complete semiconductor devices (FIG. 11D).

Furthermore, in these days, it is proposed that such the CSP undergoes three-dimensional packaging (stack mounting). For example, it is proposed in JP-A-6-5665 and JP-A-2000-243900 that semiconductor chips are stacked through a conductive member formed on the side wall of the semiconductor chips. In this proposal, through holes are disposed on scribing lines of a wafer formed with devices to be the semiconductor chips, and the conductive member is formed on the inner wall of the through holes.

In addition, it is proposed in JP-A-2002-93942 that a wiring layer (conductive member) is formed from the front side through the side to the back side of a semiconductor chip, external terminals are disposed on the front and back sides of the semiconductor chip, and a plurality of the semiconductor chips is stacked through the external terminals. In this proposal, a trench (groove) is formed by controlling the depth to reach from the back side of a wafer formed with devices to be the semiconductor chips to a redistribution wiring portion formed on the front side, an insulating material (resin) is filed in the groove to form through holes in the insulating material, and a conductive member is formed on the inner wall thereof.

[Patent Document 1]

JP-A-6-5665

[Patent Document 2]

JP-A-2000-243900

[Patent Document 3]

JP-A-2002-93942

SUMMARY OF THE INVENTION

However, in any of the proposals above, since the wafer (semiconductor chip) is directly cut to form a through hole or groove, mechanical stress is applied to the wafer to cause cracks. In addition, the area to form the through hole or groove needs to be secured on the wafer, causing a problem that the number of chips to be obtained is reduced to increase costs.

Furthermore, the proposals described in JP-A-6-6556 and JP-A-2000-243900 have problems that the pitch between the terminals is short and used only for chips of a small pin count, the expansion of the pitch between the terminals (connectivity to a motherboard) and the conformability to finer chips (small chips with multi-pin) cannot be secured, and the response to the reduction of the chip itself is to inevitably shorten the pitch between the terminals because the through holes are directly formed on the wafer (semiconductor chip) and the conductive member is formed on the inner wall thereof.

Moreover, the proposal described in JP-A-2002-93942 has a problem that high-precision processing is needed to require costs because the dimensions of the adjacent devices need to be set beforehand in a wafer state and the trench (groove) needs to be cut by controlling the depth so as to reach the redistribution wiring portion.

Therefore, an object of the invention is to solve the problems before and to achieve the objects below. More specifically, a first object of the invention is to provide a highly reliable, inexpensive semiconductor device eventhough a semiconductor device having a conductive layer on the side of a chip can be obtained without applying mechanical stress to the chip, and to provide a method for fabricating the same.

In addition, a second object of the invention is to provide a semiconductor device which can secure the expansion of the pitch between terminals and the conformability to finer chips (small chips with multi-pin) without unnecessarily shortening the pitch between the terminals for the reduction in size, and to provide a method for fabricating the same.

The objects are to be solved by the schemes below. More specifically, the invention is:

(1) A semiconductor device is characterized by including:

a semiconductor chip having an electrode pad electrically connected to an integrated circuit and a conducting part electrically connected to the electrode pad;

an insulating material formed on a side of the semiconductor chip; and a conductive pattern to extend from a top of a front side of the insulating material to the conducting part of the semiconductor chip.

(2) The semiconductor device in (1) is characterized by including first and second semiconductor devices, wherein the first semiconductor device and the second semiconductor device are stacked to each other by connecting one ends of the conductive patterns of the devices through a connecting member.

(3) The semiconductor device in (1) is characterized by including first and second semiconductor devices, wherein the first semiconductor device and the second semiconductor device are stacked by connecting the conductive patterns of the devices through a bar-shaped connecting member.

(4) The semiconductor device in (3) is characterized in that a ball-shaped electrode is disposed at a tip end of the bar-shaped member as an external terminal.

(5) The semiconductor device in (1) is characterized in that a first terminal electrically connected to the integrated circuit is disposed on a first main surface side of the semiconductor chip, and a second terminal electrically connected to the conductive pattern is disposed on a second main surface side opposite to the first main surface side.

(6) The semiconductor device in (5) is characterized by including first and second semiconductor devices, wherein the first semiconductor device and the second semiconductor device are stacked by connecting the second terminal of the first semiconductor device to the first terminal of the second semiconductor device.

(7) A method for fabricating a semiconductor device is characterized by including the steps of:

preparing a plurality of semiconductor chips having an electrode pad electrically connected to an integrated circuit and a conducting part electrically connected to the electrode pad;

arranging the semiconductor chips so as to dispose a clearance between the plurality of the semiconductor chips at predetermined intervals;

filling an insulating material on a front side of each of the semiconductor chips and in the clearance between the semiconductor chips so as to expose a part of the conducting part;

forming a through hole in the insulating material at a position of the clearance;

forming a conductive pattern to extend from an inner wall of the through hole to the conducting part of the semiconductor chip; and cutting the insulating material along the through hole and separating the plurality of the semiconductor chips into individual pieces.

BRIEF DESCRIPTION OF THE DRAWINGS

The teachings of the invention can be readily understood by considering the following detailed description in conjunction with the accompanying drawings, in which.

DESCRIPTION OF THE PREFERRED EMBODIMENT

Hereafter, embodiments of the invention will be described with reference to the drawings.

In addition, those having substantially the same function are designated the same reference numerals and signs throughout the drawings for description, sometimes omitting the description depending on the circumstances.

First Embodiment

Figure 1A:
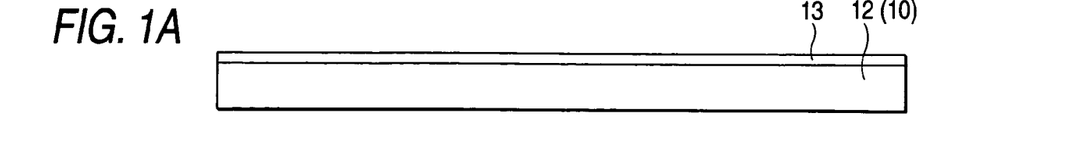
FIGS. 1A to 1F are process diagrams for illustrating a method for fabricating a semiconductor device in a first embodiment.
Figure 1B:
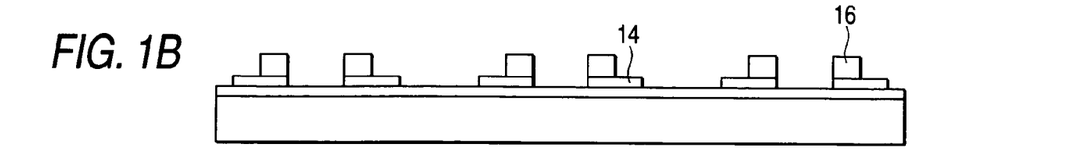

FIGS. 1A to 1F are process diagrams for illustrating a method for fabricating a semiconductor device in a first embodiment. FIGS. 2A and 2B are schematic block diagrams depicting the semiconductor device in the first embodiment; 2A is a plan view and 2B is a partial cross section.

A semiconductor device 100 in the first embodiment is configured in which an insulating material 20 is formed on the side of a semiconductor chip 10 and a conductive layer 24 (conductive pattern) and an interconnect 26 (conductive pattern) are formed to extend from the top of the front side of the insulating material 20 to posts 16 of the semiconductor chip 10. Furthermore, the semiconductor chip 10 is configured to include an insulating film 13 for protecting integrated circuits formed on the front side thereof, electrodes (electrode pads, not shown) electrically connected to the integrated circuits, a redistribution wiring layer 14 as abase for forming wiring routed from the electrodes and the posts 16 (conducting part), and the posts 16 formed on the redistribution wiring layer 14.

As is shown in FIG. 2A, the conductive pattern 26 has a first width near to the posts 16, underlaying redistribution wiring layer 14 and conducting parts of the chip 10, and a greater second width near to the conductive layer 24, the second width being wider than the first width.

Next, the semiconductor device 100 in the first embodiment will be described in more detail in accordance with the fabrication method. First, as shown in FIGS. 1A to 1F, a wafer 12 formed with integrated circuits of devices to be the semiconductor chips 10 is prepared, and the insulating film 13 made of polyimide is formed on the front side of the wafer 12 (FIG. 1A). To have contact with the electrodes (electrode pads, not shown) electrically connected to the integrated circuits, the insulating film 13 on the electrodes is removed, and the redistribution wiring layer 14 is formed as a base for forming wiring routed from the electrodes and the posts 16 (conducting part) by sputtering or plating.

Subsequently, to form the posts 16, a resist is applied over the wafer 12, and a mask is used to form openings in the resist by exposure and then etching. Then, the posts 16 (conducting part) are formed by plating to remove the resist for cleaning (FIG. 1B).

Figure 1C:
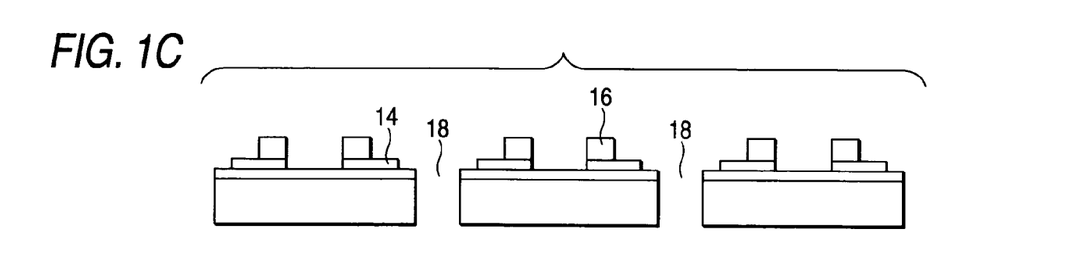
Figure 1D:
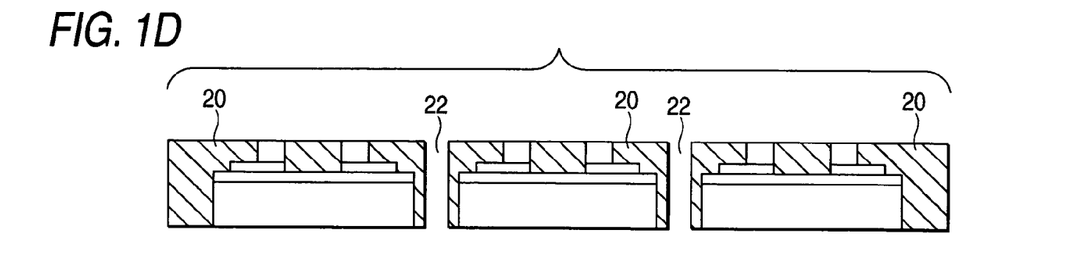
Figure 2A:
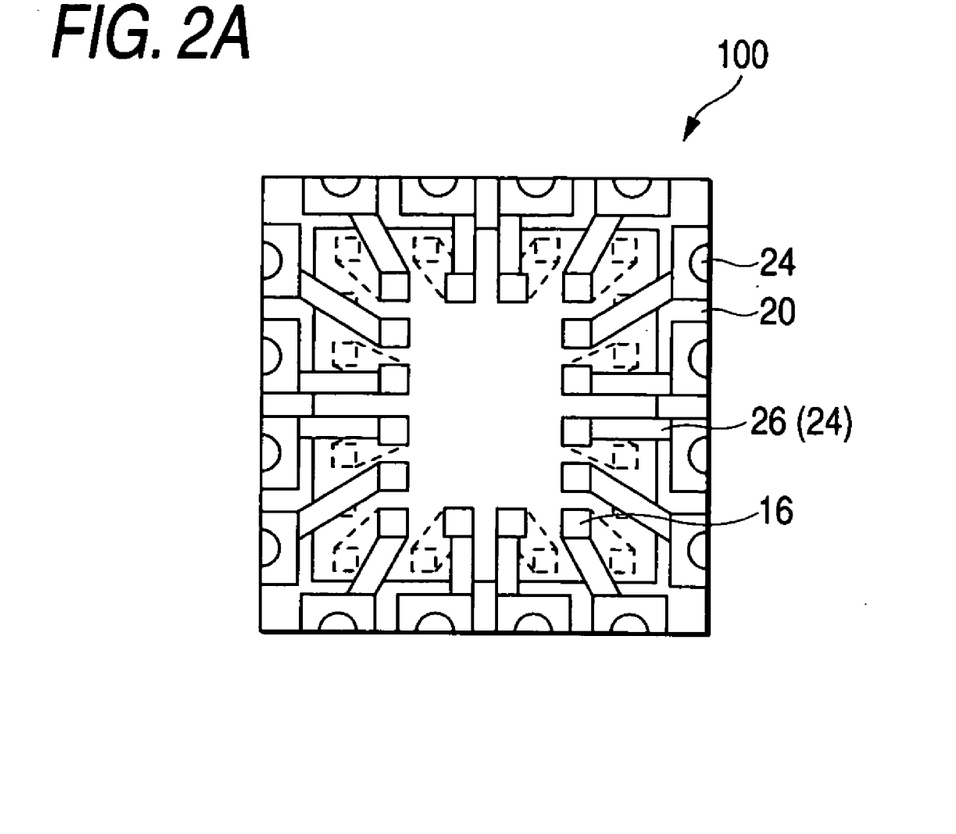
FIGS. 2A and 2B are schematic block diagrams depicting the semiconductor device in the first embodiment, 2A is a plan view and 2B is a partial cross section.
Figure 2B:
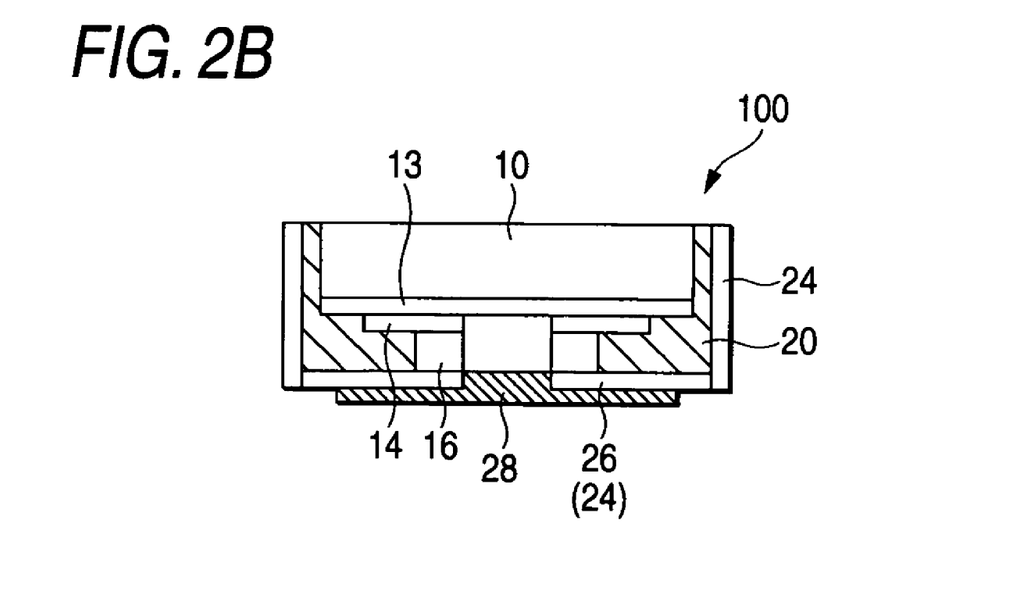

After that, the wafer is separated into individual pieces by scribing, and the separated semiconductor chips 10 are detached from each other so as to dispose a clearance 18 between the chips at predetermined intervals (FIG. 1C). Then, the insulating material 20 (resin) is formed so as to be filled in the clearance 18 between the chips as well as it covers the front side of the chips. Subsequently, a predetermined number of through holes 22 penetrating from the front to back sides is formed at predetermined positions of the insulating material 20 filled in the clearances 18 by laser irradiation, and the front side of the posts 16 is exposed by cutting (FIG. 1D).

Figure 1E:
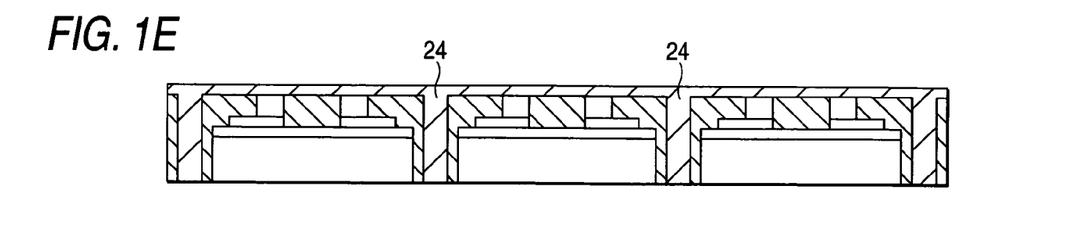

After that, the conductive layer 24 is formed by plating so as to cover the front side of the chips and the inner wall of the through holes 22 (FIG. 1E). Here, it is acceptable that the conductive layer 24 is formed so as to cover the inner wall of the through holes 22 or to bury the inside of the through holes 22.

Figure 1F:
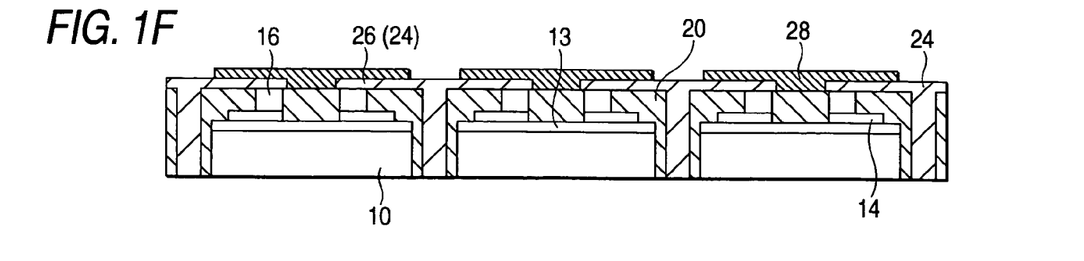
Figure 3:
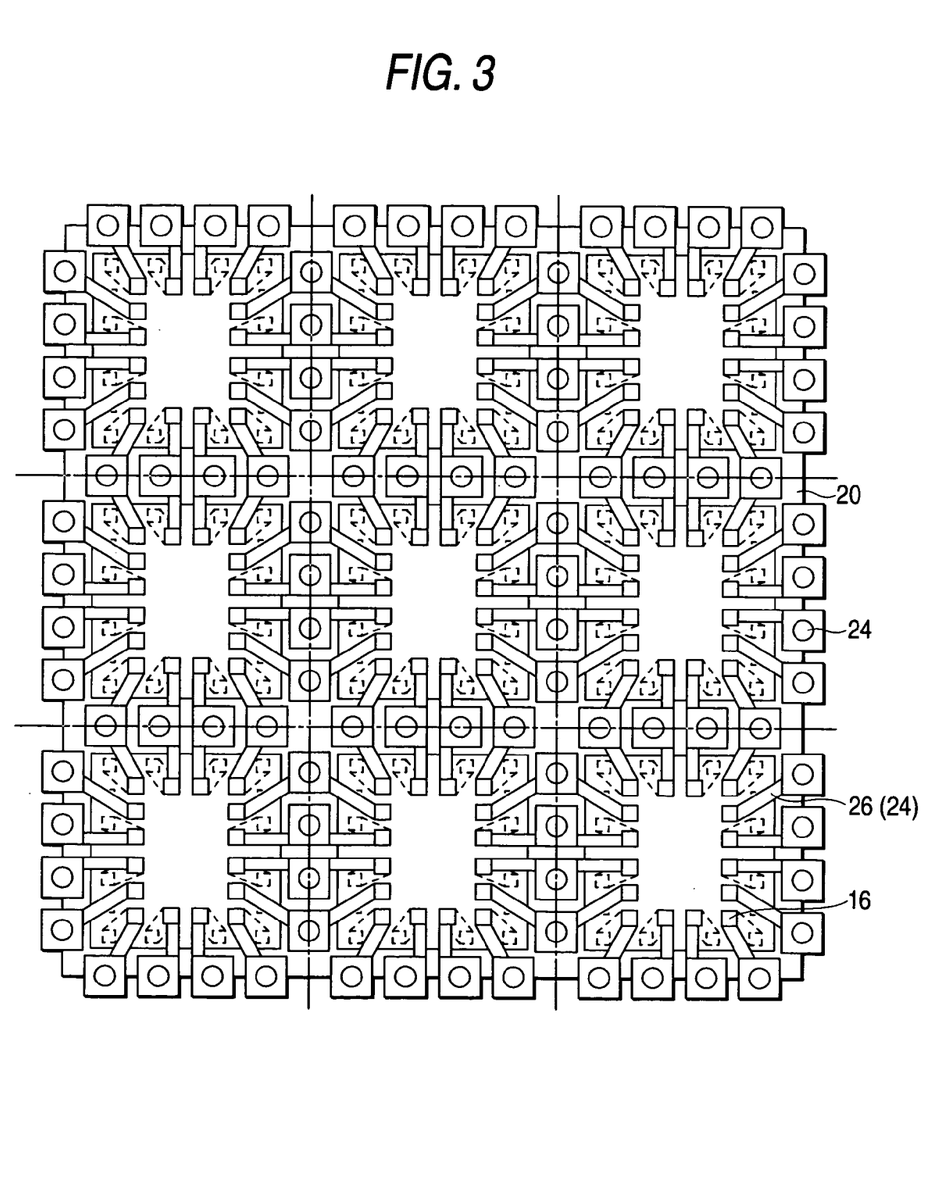
FIG. 3 is a plan view for illustrating the method for fabricating the semiconductor device in the first embodiment.

Subsequently, as shown in FIG. 3, the conductive layer 24 formed on the front side of the chips is etched by photolithography to undergo wiring process, and the interconnects 26 having a predetermined pattern are formed. To protect the interconnects 26, a solder resist 28 is formed on the front side of the chips (FIG. 1F).

Then, the wafer is separated into individual pieces by scribing so as to split the through holes 22, and thus the semiconductor device 100 can be obtained in which the conductive layer 24 is formed on the side of the semiconductor chip 10 as shown in FIGS. 2A and 2B.

In the embodiment, the insulating material 20 is formed on the side of the semiconductor chip 10, and the conductive layer 24 (conductive pattern) and the interconnects 26 (conductive pattern) are formed, both extending from the front side of the insulating material 20 to the posts 16. Therefore, it is a semiconductor device obtained without applying mechanical stress to the chip which is highly reliable with no cracks and no wiring peeling.

More specifically, in the embodiment, a plurality of the semiconductor chips 10 separated into individual pieces is arranged so as to have the clearance 18 at predetermined intervals, and the insulating material 20 is filled in the clearance 18 to form the through holes in the insulating material 20. Then, the conductive layer 24 is formed on the inner wall of the through holes 22, the insulating material 20 is cut along the through holes 22, and the semiconductor chips 10 are separated into individual pieces.

In this manner, the through holes 22 formed with the conductive layer 24 on the side of the chips are formed in the insulating material 20 filled in the clearances 18 between the plurality of the chips, and thus the semiconductor devices can be obtained without applying the mechanical stress to the chips. Accordingly, the obtained semiconductor devices are highly reliable with no cracks and no wiring peeling.

Additionally, in the embodiment, it is unnecessary to form areas to directly dispose the through holes 22 on the wafer 12, and thus the number of chips to be obtained from a single wafer can be increased. In addition to this, high-precision processing is unnecessary and cost reductions can be realized because the through holes 22 penetrating from the front to back sides are formed.

Furthermore, in the embodiment, the conductive layer 24 is formed on the side of the chips through the insulating material 20, and thus the pitch to form the conductive layer 24 (pitch to form the through holes) can be expanded as compared with the case where the conductive layer 24 is directly formed on the side of the chips (for example, the through holes 22 are directly formed on the wafer 12). Accordingly, the conductive layer 24 formed on the side of the chips is utilized as connecting terminals, which can secure the expansion of the pitch between the terminals and the conformability to finer chips (small chips with multi-pin) without unnecessarily shortening the pitch between the terminals for the reduction in size.

Second Embodiment

Figure 4:
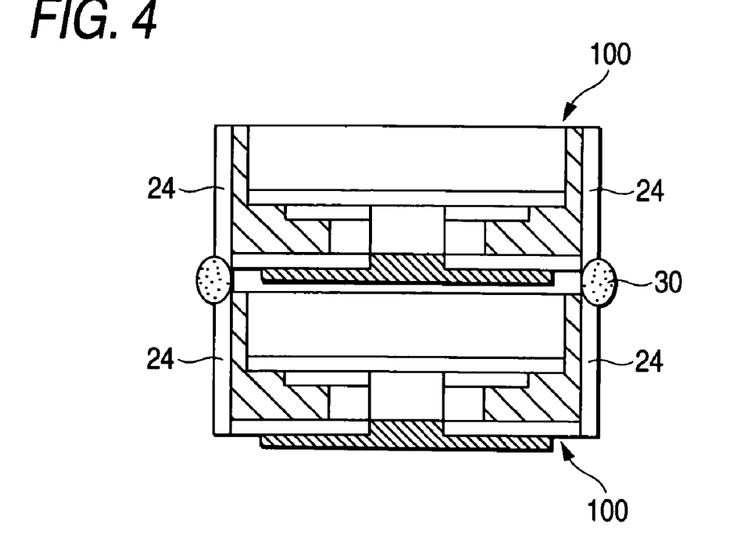
FIG. 4 is a partial cross section depicting a semiconductor device in a second embodiment.

FIG. 4 is a partial cross section depicting a semiconductor device in a second embodiment.

The second embodiment is the form that the semiconductor devices 100 in the first embodiment are stacked. In the embodiment, one ends of the conductive layers 24 formed on the sides of the semiconductor chips 10 are joined to each other through connecting members 30 such as solder to stack two semiconductor devices 100.

In the embodiment, since one end of the conductive layer 24 is used as a terminal, the pitch between the terminals can be set wider than that of traditional ones as described above. Therefore, connection failure is hard to occur, and highly reliable three-dimensional packaging (stack mounting) is feasible. For example, the embodiment can be utilized effectively to increase processing capacity in semiconductor devices such as memories.

Third Embodiment

Figure 5:
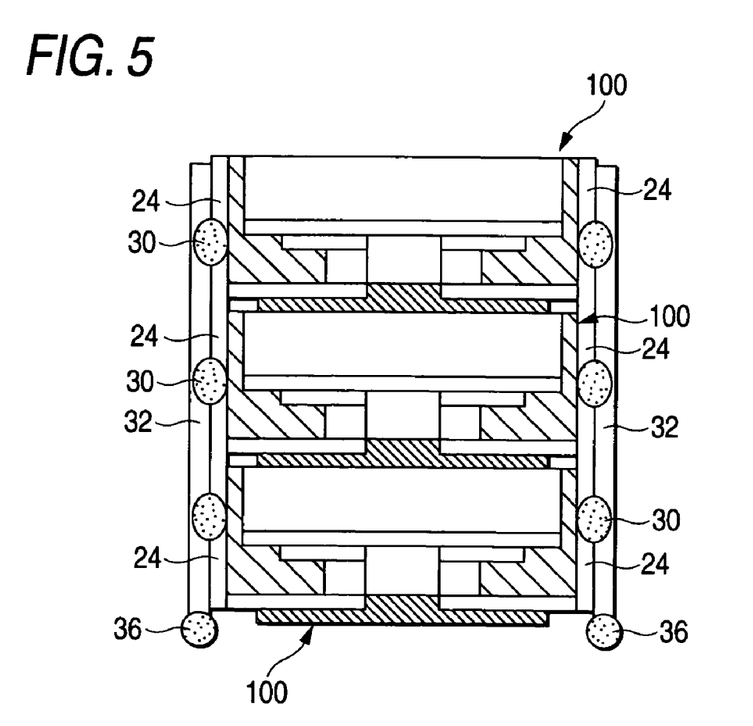
FIG. 5 is a partial cross section depicting a semiconductor device in a third embodiment.

FIG. 5 is a partial cross section depicting a semiconductor device in a third embodiment.

The third embodiment is the form that the semiconductor devices 100 in the first embodiment are stacked. In the embodiment, bar-shaped connecting materials 32 are attached to the conductive layers 24 formed on the sides of the semiconductor chips 10 with the connecting member 30 such as solder, and three semiconductor devices 100 are stacked through the bar-shaped connecting materials 32. In addition, a solder ball 36 is formed at the tip end of the bar-shaped connecting material 32 as a connecting terminal. The stacked semiconductor devices are mounted on a wiring board through the solder balls 36.

In the embodiment, connection failure is hard to occur, and highly reliable three-dimensional packaging (stack mounting) is feasible as similar to the second embodiment.

Furthermore, in the embodiment, many semiconductor devices 100 can stably undergo three-dimensional packaging (stack mounting) because the semiconductor chips 10 are connected to each other through the bar-shaped connecting material 32. Moreover, it becomes a cushion against the torsion of the wiring board or against mechanical stress to secure connection reliability because the devices are mounted on the wiring board through the bar-shaped connecting materials 32 as well.

Additionally, in the embodiment, since the pitch of the conductive layer 24 disposed on the side of the chips is wide as described above, the bar-shaped connecting material 32 of large diameter can be used, and it can be realized to improve handiness and to secure strength in the bar-shaped connecting materials 32.

Fourth Embodiment

Figure 6A:
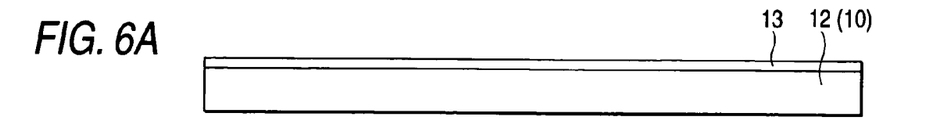
FIGS. 6A to 6G are process diagrams for illustrating a method for fabricating a semiconductor device in a fourth embodiment.
Figure 6B:
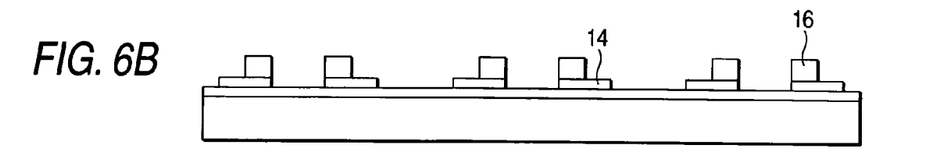
Figure 6C:
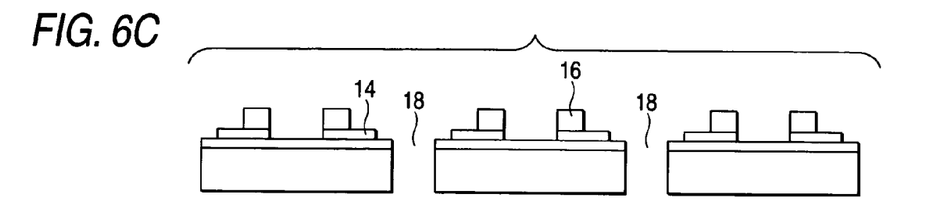
Figure 6D:
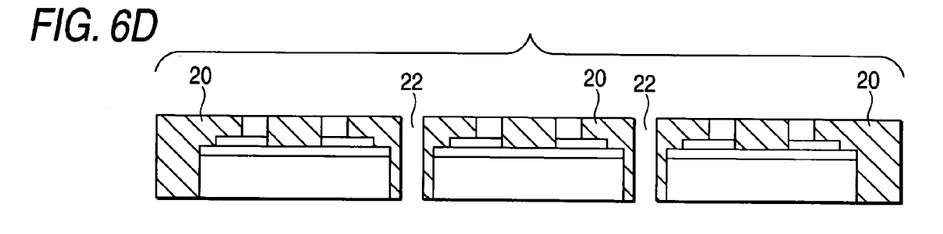
Figure 6E:
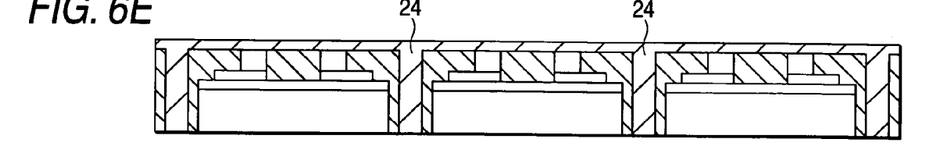
Figure 6F:
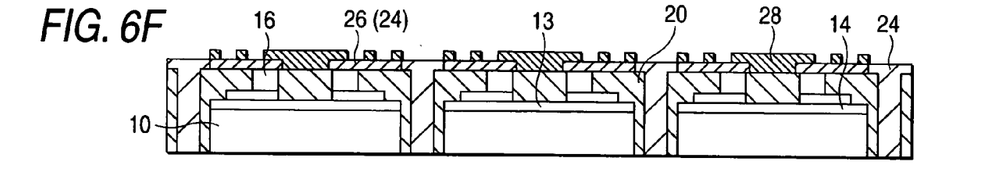
Figure 6G:
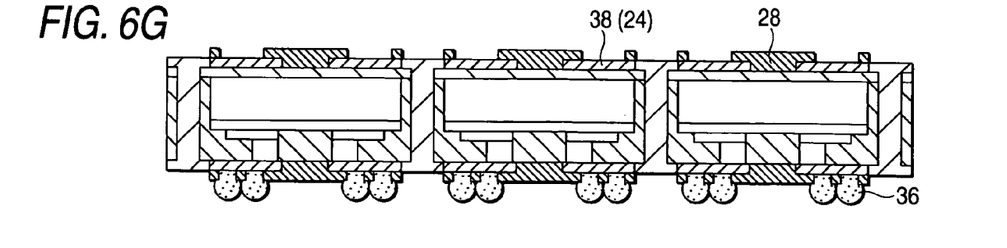
Figure 7A:
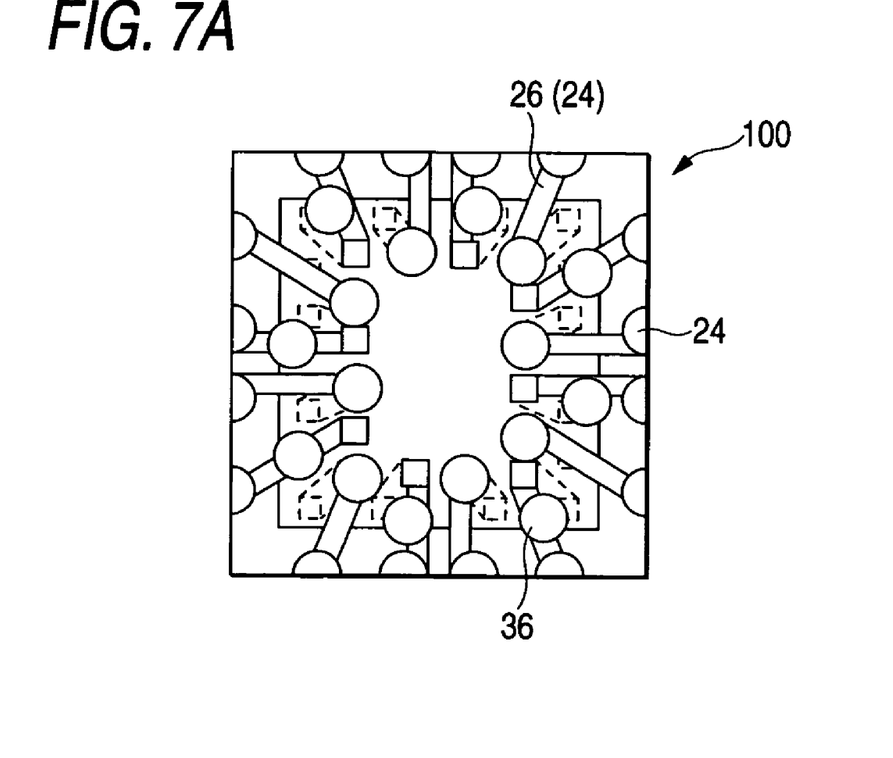
FIGS. 7A and 7B are schematic block diagrams depicting the semiconductor device in the fourth embodiment, 7A is a plan view and 7B is a partial cross section.
Figure 7B:
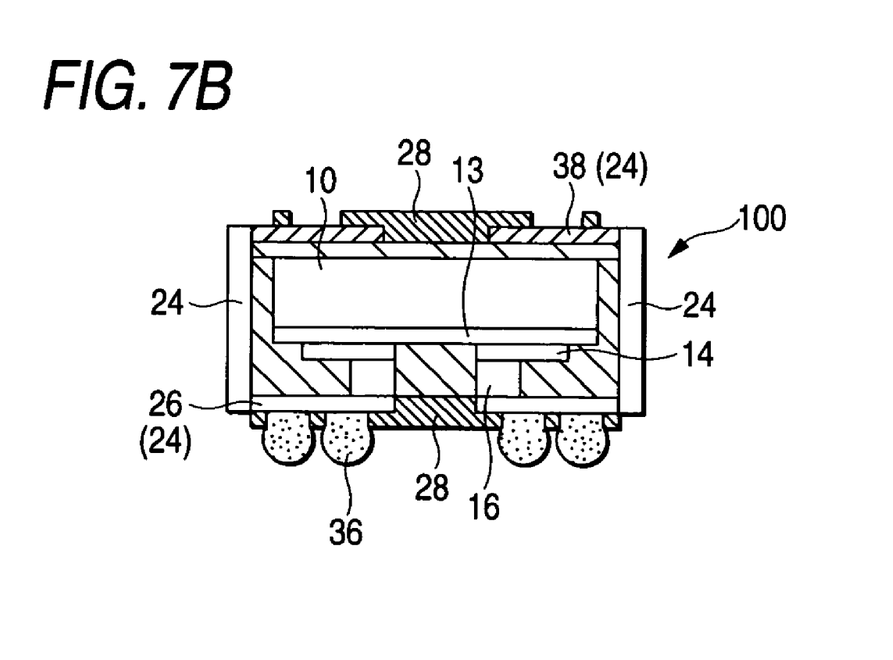

FIGS. 6A to 6G are process diagrams for illustrating a method for fabricating a semiconductor device in a fourth embodiment. FIGS. 7A and 7B are schematic block diagrams depicting the semiconductor device in the fourth embodiment; 7A is a plan view and 7B is a partial cross section.

The fourth embodiment is the form that terminals (interconnects) electrically connected to a conductive layer 24 are formed on the back side of the chips of the semiconductor device in the first embodiment (second main surface side). The fourth embodiment will be described in accordance with the method for fabricating the same. First, as shown in FIGS. 6A to 6G, the process steps that a wafer 12 formed with integrated circuits of devices to be semiconductor chips 10 is prepared and a part of the interconnects 26 is exposed on the front side of the chips to form a solder resist 28 in order to protect the interconnects 26 are the same as those in the first embodiment, and thus the description is omitted (FIGS. 6A to 6F).

Figure 8:
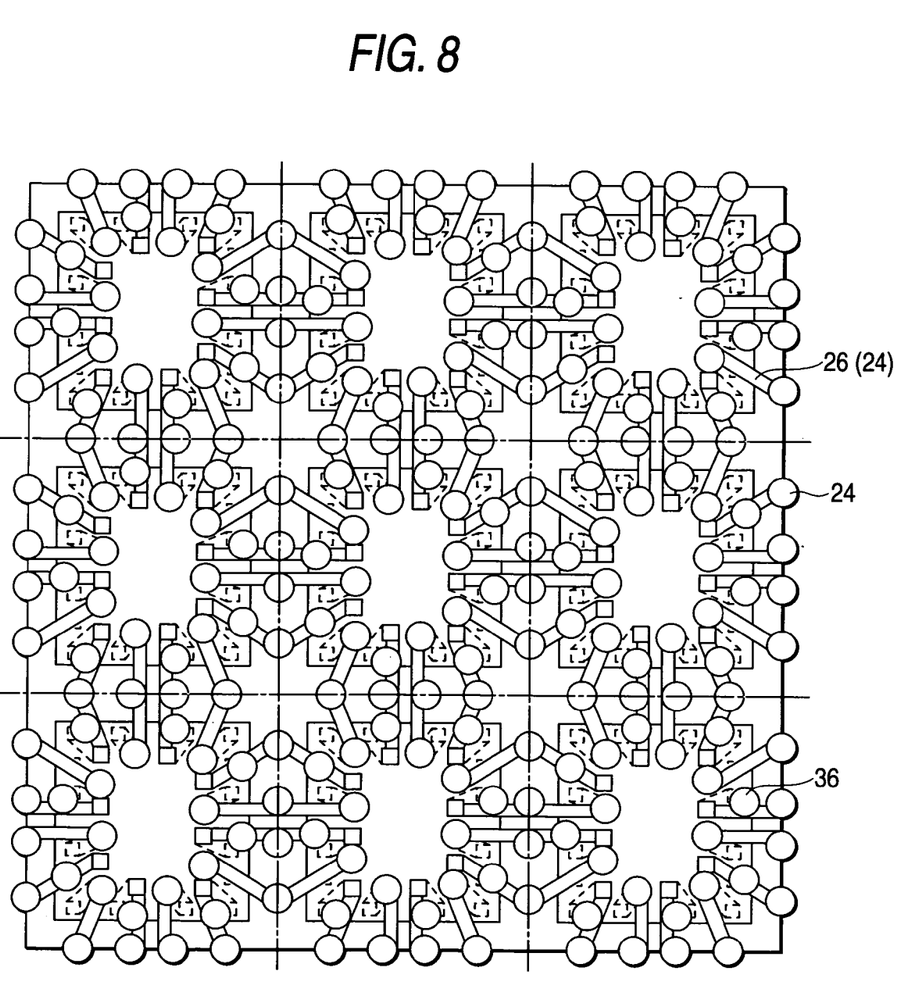
FIG. 8 is a plan view for illustrating the method for fabricating the semiconductor device in the fourth embodiment.

After that, the wafer 12 is reversed, an insulating material 20 is also covered on the back side (the side opposite to the front side where the interconnects 26 are formed), and through holes 22 (the conductive layer 24 on the inner wall of the through holes 22) are exposed to form the conductive layer 24 by plating. Subsequently, the conductive layer 24 formed on the back side of the chips is etched by photolithography to undergo wiring process, and interconnects 38 having a predetermined pattern is formed. Then, the solder resist 28 is also formed on the back side of the chips so as to expose a part of the interconnects 38 in order to use as connecting terminals (the exposed interconnects 38: second terminals). In the meantime, as shown in FIG. 8, solder balls 36 (first terminals) are formed on the interconnects 26 exposed on the front side of the chips as connecting terminals (FIG. 6G).

After that, the wafer is separated into individual pieces by scribing so as to split the through holes 22. Thus, the conductive layer 24 is formed on the side of the semiconductor chips 10 as shown in FIGS. 7A and 7B, and the semiconductor device 100 having the interconnects 38 (terminals) electrically connected to the conductive layer 24 on the back side can be obtained.

In the embodiment, since the terminals are formed on the front and back sides of the semiconductor device, the terminals (the interconnects 38) on the back side are used to confirm conductivity after it is mounted on the wiring board, for example.

Fifth Embodiment

Figure 9:
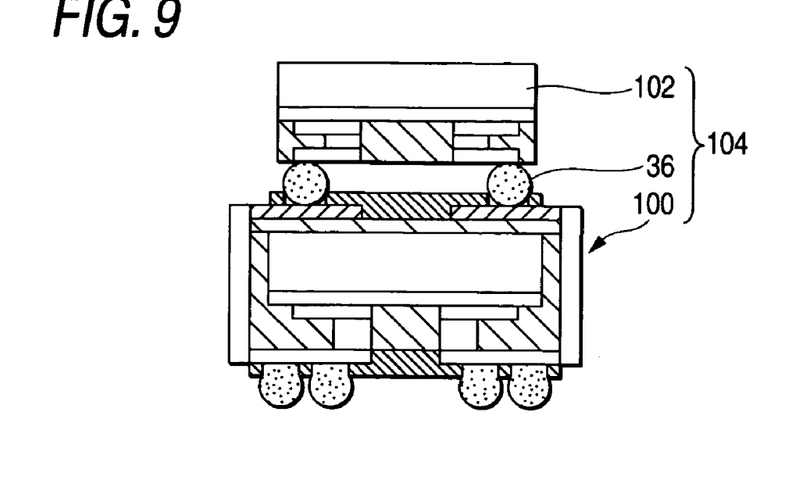
FIG. 9 is a partial cross section depicting a semiconductor device in a fifth embodiment.

FIG. 9 is a partial cross section depicting a semiconductor device in a fifth embodiment.

The fifth embodiment is the form that an existing CSP type semiconductor device 102, for example, is stacked on the semiconductor device 100 in the fourth embodiment. In a semiconductor device 104 of the embodiment, the exposed interconnects 38 on the back side of the semiconductor device 100 are used as connecting terminals, and the connecting terminals are connected to solder balls 36 being the connecting terminals of the existing CSP type semiconductor device 102, thereby connecting the semiconductor devices 100 and 102 each other.

In the embodiment, since the interconnects 38 on the back side of the semiconductor device 100 are patterned more flexible (the design of arranging the terminals), proper terminal arrangement is possible in accordance with semiconductor devices to be stacked, and semiconductor devices having different functions (the arrangement of the connecting terminals is varied) can easily undergo three-dimensional packaging.

Sixth Embodiment

Figure 10:
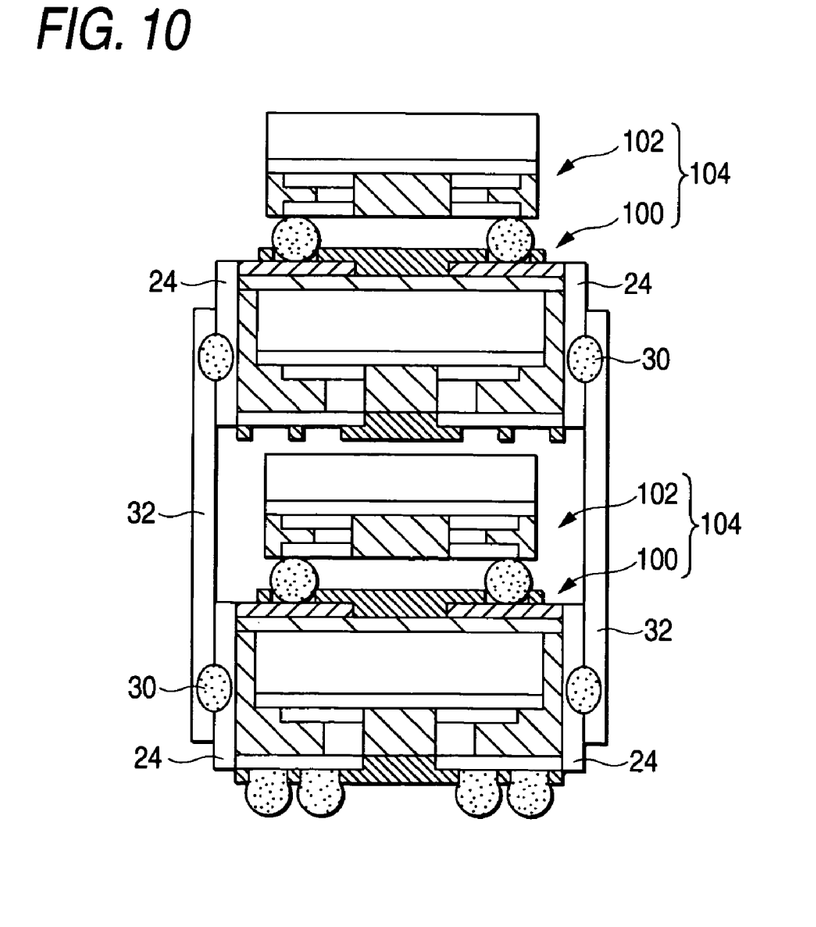
FIG. 10 is a partial cross section depicting a semiconductor device in a sixth embodiment.

FIG. 10 depicts a semiconductor device in a sixth embodiment.

The sixth embodiment is the form that the semiconductor devices 104 in the fifth embodiment are stacked. In the embodiment, conductive bar-shaped connecting materials 32 are attached to the conductive layers 24 of the semiconductor devices 104 (the semiconductor device 100) with a connecting member 30 such as solder, and two semiconductor devices 104 are stacked through the bar-shaped connecting materials 32. However, the solder balls 36 are not formed on the semiconductor device 104 stacked above.

In the embodiment, the semiconductor devices 104 of the fifth embodiment having the different function are connected by joining the conductive layers 24 through the bar-shaped connecting materials 32. Therefore, three-dimensional packaging is feasible easily, and higher-density packaging is possible.

In addition, it is without saying that any of the embodiments described above are not interpreted limitedly, which can be implemented within the scope of satisfying the requirements of the invention.

As described above, according to the semiconductor device of the invention and the method for fabricating the same, a highly reliable semiconductor device can be provided at low costs even though a semiconductor device having the conductive layer on the side of the chip can be obtained without applying mechanical stress to the chip. Additionally, the expansion of the pitch between the terminals and the conformability to finer chips (small chips with multi-pin) can be secured without unnecessarily shortening the pitch between the terminals for the reduction in size.

What is claimed is:

1. A method for manufacturing a semiconductor device comprising;
   preparing a plurality of semiconductor chips each including an electrode pad electrically connected to an integrated circuit and a conducting part electrically connected to the electrode pad, wherein the electrode pad and the conducting part are formed on a front side of each of the semiconductor chips;
   arranging the semiconductor chips so as to dispose a clearance between the plurality of the semiconductor chips at predetermined intervals;
   filling an insulating material on the front side of each of the semiconductor chips and in the clearance between the semiconductor chips so as to expose a part of the conducting part;
   forming a through hole in the insulating material at a position of the clearance;
   forming a conductive pattern to extend from an inner wall of the through hole to the conducting part of the semiconductor chip; and
   cutting the insulating material along the through hole and separating the plurality of the semiconductor chips into individual pieces.

2. The method according to claim 1, wherein the insulating material is resin.

3. The method according to claim 1, wherein the through hole is formed by laser irradiation.

4. The method according to claim 1, further including forming a solder resist on the front side of each of the semiconductor chips so as to cover apart of the conductive pattern.

5. The method according to claim 1, further including forming a solder ball on the conductive pattern of each of the semiconductor chips.

6. The method according to claim 1, including detaching the semiconductor chips prior to the step of arranging the semiconductor chips, and wherein the step of arranging the semiconductor chips comprises disposing the plurality of the semiconductor chips to create the clearance at the predetermined intervals.

7. The method according to claim 1, wherein the step of filling an insulating material on the front side of each of the semiconductor chips and in the clearance between the semiconductor chips so as to expose a part of the conducting part comprises a single step.

8. The method according to claim 1, wherein the steps are performed in the sequence in which they are recited.

9. The method according to claim 1, wherein no insulating material is filled into the through hole.

10. The method according to claim 1, comprising utilizing the conductive pattern as a connecting terminal.

* * * * *